(12) United States Patent
Eissa et al.

(10) Patent No.: US 6,316,350 B1
(45) Date of Patent: Nov. 13, 2001

(54) POST FUSE SLAG ETCH

(75) Inventors: Mona M. Eissa; Troy A. Yocum, both of Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/697,939

(22) Filed: Oct. 26, 2000

Related U.S. Application Data

(60) Provisional application No. 60/162,076, filed on Oct. 28, 1999.

(51) Int. Cl.⁷ .................................................. H01L 21/4763
(52) U.S. Cl. ........................... 438/637; 438/600; 438/758
(58) Field of Search .................... 438/385, 597, 438/600, 618, 619, 620, 637, 638, 639, 675, 758

(56) References Cited

U.S. PATENT DOCUMENTS

| | | | |
|---|---|---|---|
| 3,794,948 | * 2/1974 | Linton et al. | 337/242 |
| 6,061,264 | * 5/2000 | Giust et al. | 365/96 |

* cited by examiner

*Primary Examiner*—David Nelms
*Assistant Examiner*—Phuc T. Dang
(74) *Attorney, Agent, or Firm*—Jacqueline J. Garner; W. James Brady, III; Frederick J. Telecky, Jr.

(57) ABSTRACT

A post laser blown fuse slag etch for a copper fuse (30) with a barrier metal liner (18), (e.g., $Ta_xN_y$, Ta, Ti, $Ti_xN_y$). After the fuse (30) is blown, copper and copper complexes may be selectively removed using a nitric acid and $H_2O_2$ solution. Then, a corrosion inhibitor is used to passivate the surface of exposed copper (34). Next, the barrier metal (18) of slag (22) is removed using a strong basic etch chemistry comprising a base plus $H_2O_2$. This solution removes the barrier metal selectively with respect to passivation layer (e.g., silicon nitride) (16) and oxides/FSG (12). A diluted HF solution may then be used to remove any trace metal or oxidized copper.

10 Claims, 5 Drawing Sheets

POST FUSE SLAG ETCH

This application claims priority under 35 USC §119(e)(1) of provisional application No. 60/162,076 filed Oct. 28, 1999.

FIELD OF THE INVENTION

The invention is generally related to the field of semiconductor processing and more specifically to an etch for removing slag remaining after a blowing a fuse.

BACKGROUND OF THE INVENTION

In some integrated circuits, alternate interconnect paths are created to increase yield. For example, in SRAM circuits, after the last interconnect level is formed, the functionality of the device is measured. Defective interconnect paths are severed and replaced with alternative interconnect paths. The defective interconnect paths are severed by "blowing" a fuse. FIGS. 1A and 1B show a fuse 30 before and after the fuse 30 is blown, respectively. During this process, a high power laser is used to "blow" a portion of the capping layer 16 overlying the metal 20. The capping layer typically comprises silicon nitride or oxide. During this process, the metal 20 of the fuse 30 can reach an extremely high temperature (e.g., 2000° C.). As a result, the metal 20 of the fuse 30 is blown out of the fuse area within interconnect level 14. Unfortunately, some of the material from the fuse 30 is redeposited on the sidewalls of the fuse 30 and on the surface of the device. This material is referred to a slag 22. Slag 22 comprises both the metal 20 of the fuse and the liner material 18 of the fuse. To avoid unwanted shorts, the slag 22 must be removed.

Etch sequences to remove aluminum (Al) slag and TiN liners are known in the art. However, copper metal interconnects are being developed to replace aluminum interconnects to improve performance. Accordingly, there is a need to replace the Al-slag and TiN liner etch sequence with a Cu-slag and appropriate liner etch sequence.

SUMMARY OF THE INVENTION

The invention is a post laser blown fuse slag etch for a copper fuse with a barrier metal liner (e.g., $Ta_xN_y$, Ta, Ti, $Ti_xN_y$). After the fuse is blown, copper and copper complexes may be selectively removed, for example, by a nitric acid/$H_2O_2$ solution. Then, a corrosion inhibitor is used to passivate the surface of exposed copper. Next, the liner is removed using a strong basic etch chemistry comprising a base plus $H_2O_2$. This solution removes the liner selectively with respect to silicon nitride and oxides. A diluted HF solution may then be used to remove any trace metal or oxidized copper.

An advantage of the invention is providing a copper slag etch sequence that removes the barrier liner material selectively with respect to silicon nitride and oxides.

This and other advantages will be apparent to those of ordinary skill in the art having reference to the specification in conjunction with the drawings.

DETAILED DESCRIPTION OF THE EMBODIMENTS

The invention will now be described in conjunction with wet etch sequence for removing copper and barrier metal liners from a fuse after it has been "blown" using a laser. The post-fuse slag etch requires the removal of residual copper and barrier metal liner inside the laser-repair blown fuse. The invention may be applied to both top lead fuses and stacked via fuses.

Figure 1A:
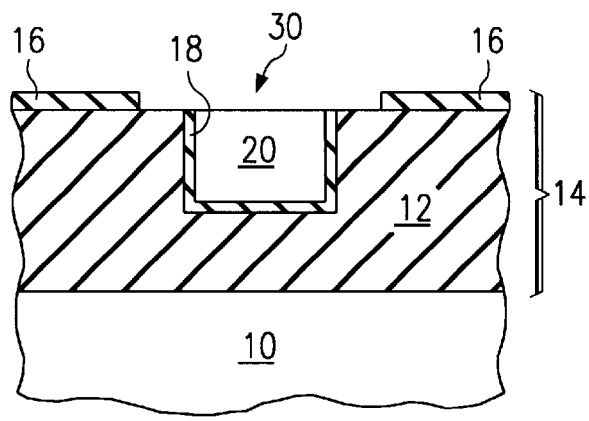
FIGS. 1A and 1B are a cross-sectional diagrams of a top lead fuse before and after the fuse is blown, respectively.
Figure 1B:
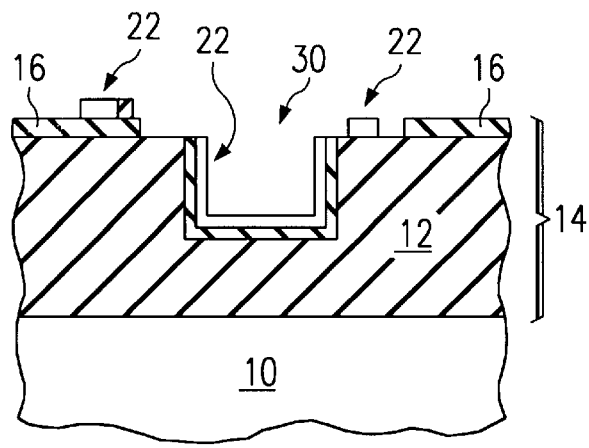
Figure 1C:
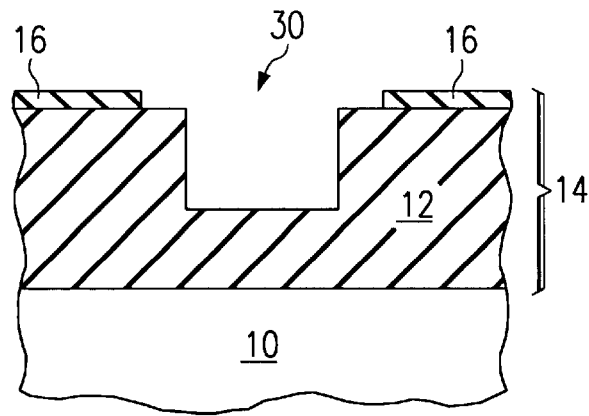
FIG. 1C is a cross-sectional diagram of the top lead fuse of FIGS. 1A and 1B after the slag etch process of the invention.
Figure 2A:
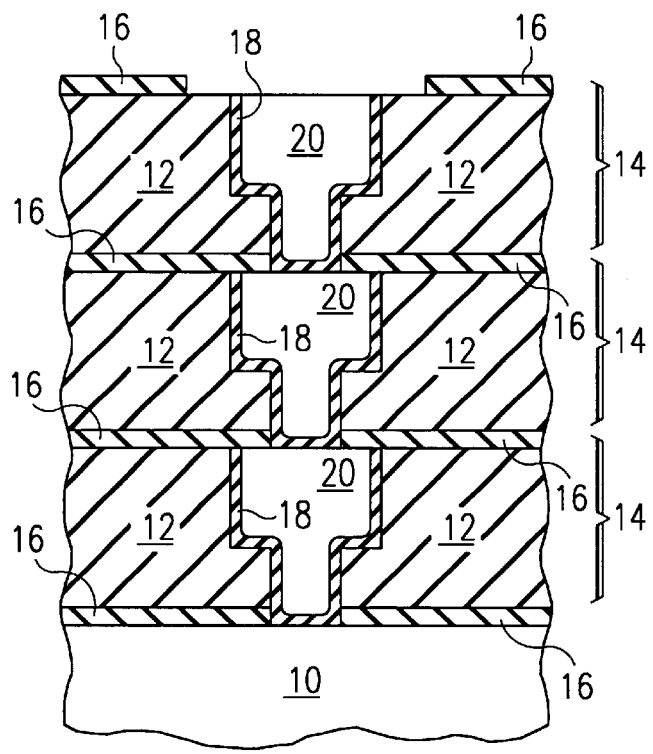
FIGS. 2A and 2B are a cross-sectional diagrams of a via stack fuse before and after the fuse is blown, respectively.
Figure 2B:
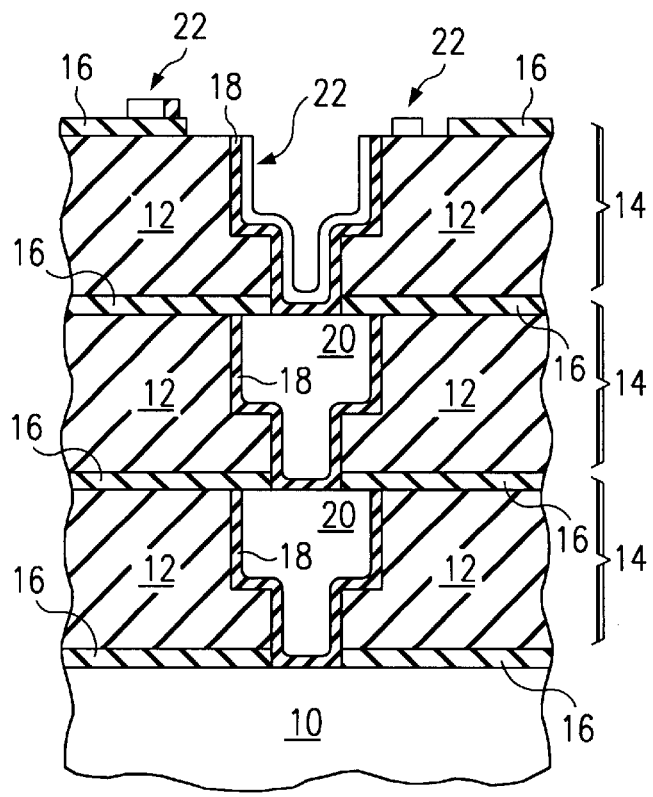
Figure 2C:
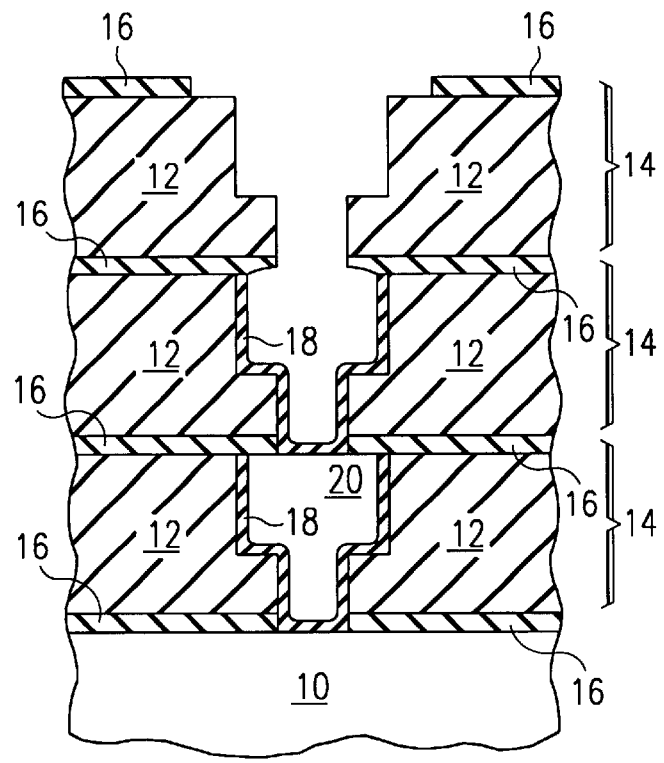
FIG. 2C is a cross-sectional diagram of the via stack fuse of FIGS. 2A and 2B after the slag etch process of the invention.

FIGS. 1A and 1B show a top lead fuse before and after the fuse has been laser blown. FIG. 1C shows the blown fuse after the slag etch of the invention. The surfaces of the passivation layer 16 (e.g., silicon nitride, oxynitride, etc.) and the ILD 12 (e.g., FSG, oxide, low k material, silicon based dielectrics, etc,) have been cleaned by removing the copper and barrier metal liner slag, any trace metals, and any oxidized copper. FIGS. 2A–2C show the invention applied to a via-stack fuse. A via stack fuse continues down to metal 1 where the fuse link is connected to the circuit. FIG. 2B shows the fuse after it has been blown and before the slag etch of the invention. FIG. 2C shows the results of the invention after the slag etch has been performed.

A semiconductor body 10 is processed through the formation of one or more metal interconnect levels 14 as shown in FIGS. 1A and 2A. Each interconnect level comprises a dielectric layer 12 (IMD and/or ILD), liner 18, metal lines 20, and a passivation layer 16. In the preferred embodiment, dielectric layer 12 comprises fluorine doped silicate glass (FSG). Other suitable dielectric materials such as other oxides, low k materials, and silicon-based dielectrics, will be apparent to those of ordinary skill in the art. For example, PETEOS (plasma enhanced tetraethyoxysilane), and/or an organic silicate glass (OSG) may be used. Liner 18 comprises a barrier metal such as $Ta_xN_y$, Ta, Ti, $Ti_xN_y$, or combinations thereof. Passivation layer 16 typically comprises silicon nitride. However, other suitable materials, such as oxynitrides, will be apparent to those of ordinary skill in the art.

Some portion of the metal lines 20 in an interconnect level 14 are used as fuses 30. After the desired metal interconnect level 14 is formed, it becomes desirable to sever one or more fuse 30 connections. In an SRAM, for example, a functionality test is performed to determine yield after the sixth level of interconnect is formed. A high powered laser is use to blow the desired fuses 30 to sever defective interconnect paths. The defect paths are then replaced with an alternative path.

FIGS. 1B and 2B show a laser blown fuse 30. After fuse 30 is blown, slag 22 remains on the surface of dielectric layer 12 in fuse 30 and on the surface of passivation layer 16. Slag 22 includes both copper and barrier metal liner material. To avoid unwanted shorts, slag 22 must be removed.

The invention is a method for removing barrier metal and copper of slag 22 with high selectivity against passivation layer 16 (e.g., silicon nitride) and dielectric 12 (e.g., FSG). This method is also capable of removing slag 22 without significantly damaging the exposed copper of non-blown fuses. The process of the invention will now be described in conjunction with FIGS. 3A–3D (cross-section) and FIGS. 4A–4B (top view). Fuse 30 of FIGS. 3A–3D and 4A–4B correspond to either of the like-numbered fuses of FIGS. 1A–1C and 2A–2C. FIGS. 3A–3D also show a non-blown fuse 34. The top view illustrations of FIGS. 4A–4B do not show passivation layer 16 (or slag 22) for clarity.

Figure 3A:
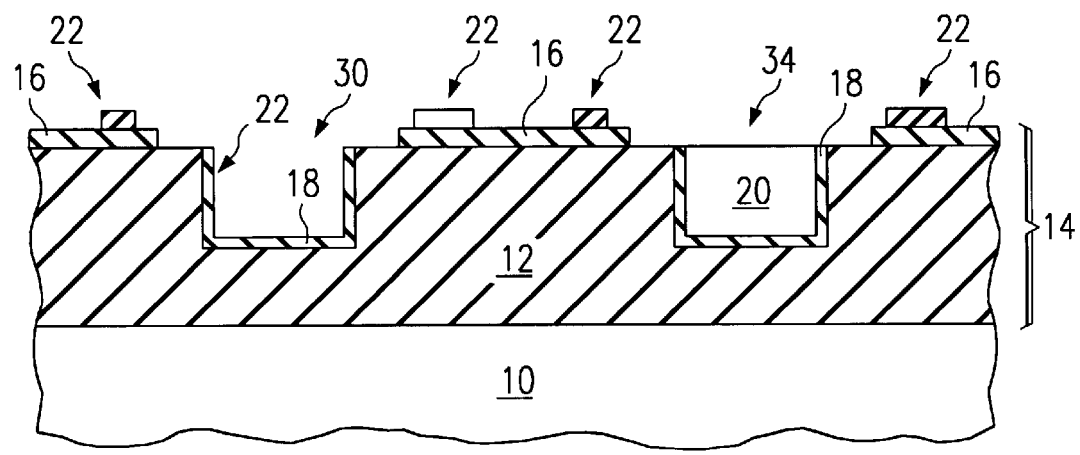
FIGS. 3A–3D are cross-sectional diagrams of the fuse of FIGS. 1A–1C at various stages of the slag etch according to the invention.
Figure 3B:
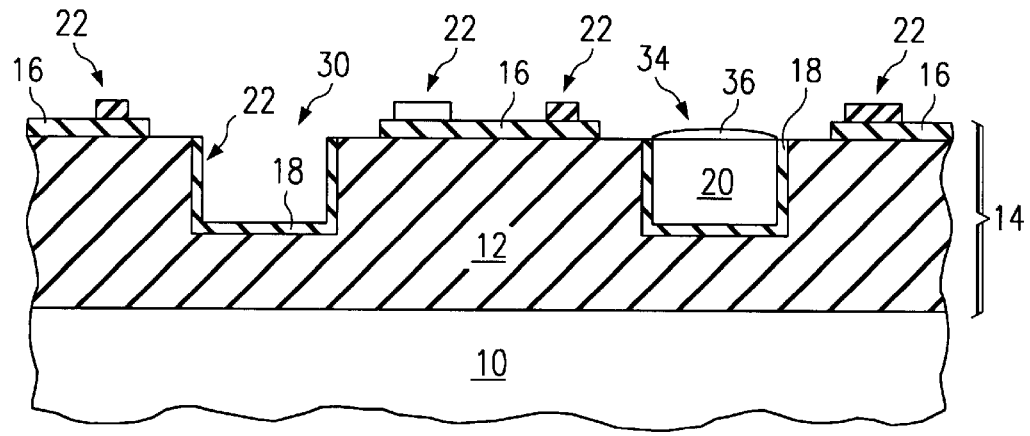
Figure 4A:
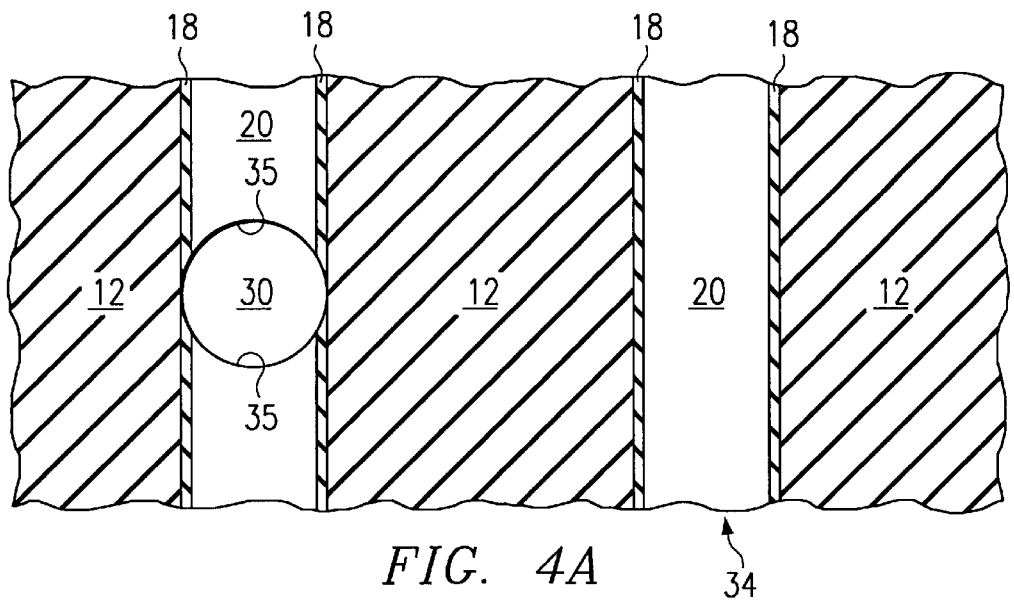
FIGS. 4A–4B are top views corresponding to FIGS. 3A–3B (without passivation layer 16).

The first step is an optional nitric acid $H_2O_2$ etch. This step removes a portion of the copper slag without removing barrier metal, passivation layer 16, or ILD 12, as shown in FIGS. 3A & 4A. A short etch of approximately 10 seconds is used. Thus, only a small amount of copper from the edges 35 of blown fuse 30 is removed. The preferred embodiment uses H2O2:HNO3:DIW at 1:20:80 for 10–60 sec.

Figure 4B:
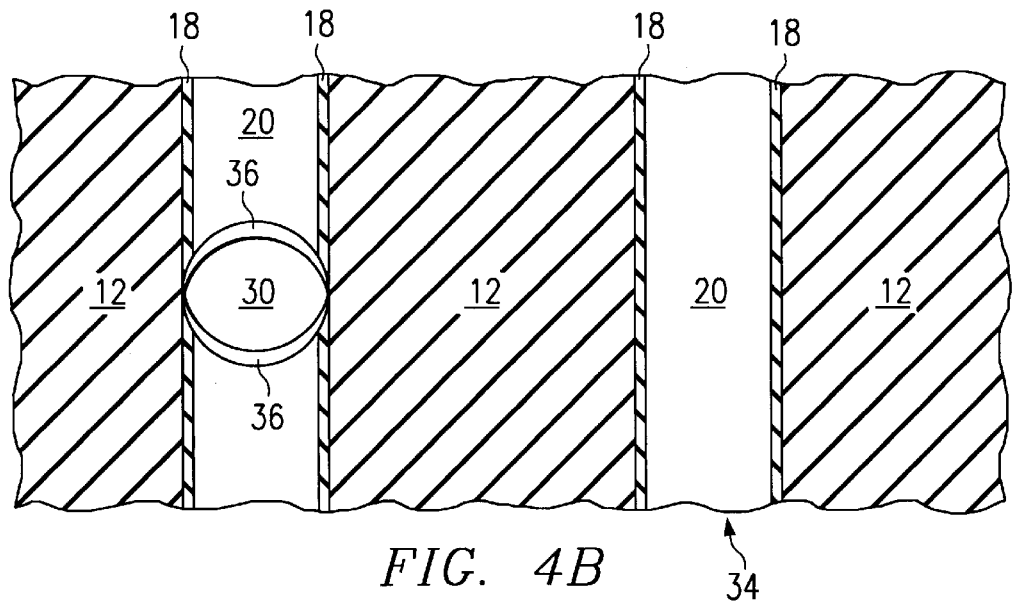

Next, the structure is subjected to a corrosion inhibitor to passivate the surface of the copper edges of blown fuse 30 and protect it from the subsequent barrier metal liner etch. Passivated copper surface 36 is shown in FIG. 4B. Although not shown, the copper at the bottom of the via is also passivated. In the preferred embodiment, a triazole such as BTA (Benzatriazole) is used.

Figure 3C:
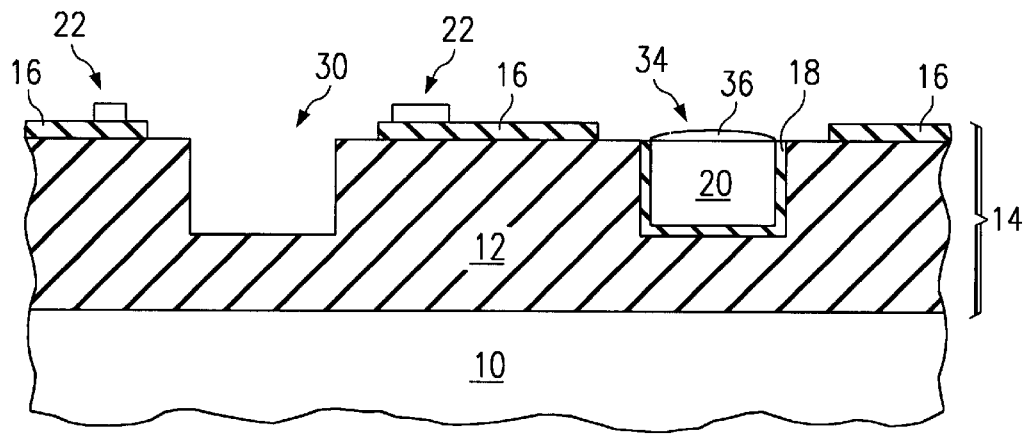

After passivating the exposed copper surface, the structure is subjected to a strong basic solution at an elevated temperature. A base solution is added to $H_2O_2$. The base solution may, for example, comprise KOH, $NH_4OH$ or TMAH (tetramethylammonium hydroxide—$(CH_3)_4NOH$). The result is shown in FIG. 3C. The ratio of base to $H_2O_2$ determines the selectivity. Higher $H_2O_2$ results in a higher barrier metal (liner 18) removal rate and lower ILD 12 (e.g., FSG) removal rate. Tables I and II list variations and the resultant removal rates.

for 5 minutes at 55° C. is used. The FSG total removal rate after 10 minutes is 40 Å, $Ta_xN_y$ is 495 Å, SiN is 35 Å, and Ta is 287 Å.

If the optional nitric acid/$H_2O_2$ step is not used, the barrier metal etch undercuts the copper and thereby removes some of the copper slag as well. The copper complexes, however, may not be undercut.

Figure 3D:
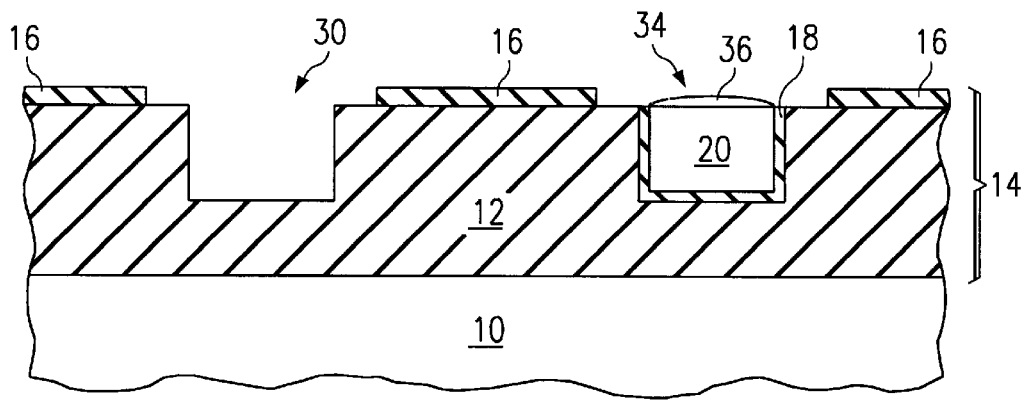

After the barrier metal liner material 18 is removed, the structure is subjected to a diluted HF etch to clean the exposed surfaces of passivation layer 16 and dielectric 12. The diluted HF etch removes any trace metal or oxidized copper. The result is shown in FIG. 3D. For example, a dilution of 1:500 of 49%HF:DIW for a duration of 10–40 sec. may be used. All of slag 22 has been removed with minimal removal of passivation layer 16, dielectric 12, and copper edges 35 of blown fuse 30.

Subsequently, the copper 20 surface may be cleaned using an organic acid such as citric acid. The organic acid removes passivated copper surface layer 36. The concentration of organic acid is preferably less than 2% and the duration is less than 5 minutes. This could be followed by a dry plasma $H_2$ passivation (@ ~250° C.) to removes any oxides from the copper surface.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of removing post laser blown fuse slag from the surface of a semiconductor body, comprising the steps of:

TABLE I

| Chemical | Ratio | Temp. | Time | ΔTaN | ΔFSG | ΔN (PE) |
|---|---|---|---|---|---|---|
| KOH:$H_2O_2$ | 3:4 | | 10 min w/meg w/o recirc | >1229 | 515.94 | 14.83 |
| TMAH:$H_2O_2$ | 4:3 | | 10 min w/meg w/o recirc | 3 | 4.8 | 1.38 |
| Nitric: 49% HF:DIW | 25:1:9 | | 5 min w/meg | >1230 | 8082 | 157.3 |
| $H_2O_2$ | 100% | room | 2 min w/o meg & recirc | −1 | 3 | 0 |
| KOH:$H_2O_2$ | 1:12 | | 2 min w/o meg & recirc | 4 | 3 | 2.03 |
| KOH:$H_2O_2$ | 1:12 | 90° C. | 2 min w/o meg & recirc | 1181 | 88 | 32.57 |

TABLE II (5 l DIW, 11.4 l KOH, 7.6 l $H_2O_2$)

| Chemical | Ratio | Temp. | Time | ΔTaN | ΔFSG | ΔTa |
|---|---|---|---|---|---|---|
| DIW:KOH:$H_2O_2$ | ~2:1:3 | 45° C. | 120 sec w/o meg & recirc | 38 | 43.35 | 27 |
| DIW:KOH:$H_2O_2$ | ~2:3:2 | 50° C. | 10 min w/o meg & recirc | 229.58 | 125.86 | 91 |
| DIW:KOH:$H_2O_2$ | ~2:3:2 | 50° C. | 10 min w/o meg & recirc | 459.52 | 107.6 | — |
| DIW:KOH:$H_2O_2$ | ~2:3:2 | 51° C. | 12 min w/o meg & recirc | 173 | — | — |
| DIW:KOH:$H_2O_2$ | 1:2.3:1.5 | 55° C. | 15 min w/o meg & recirc | 861.34 | 322.31 | 680.48 |

Preferably, the temperature is in the range of 50–70° C., the ratio of base solution to $H_2O_2$ is in the range of 2:5 to 1:1, and the duration is in the range of 200–600 sec. In the preferred embodiment, a ratio of 2:5 $H_2O_2$:$NH_4OH$ (29%)

passivating a copper portion of said surface of said semiconductor body using a triazole compound;

etching said post laser blown fuse slag at an elevated temperature with an etch chemistry comprising a base solution and $H_2O_2$; and cleaning said surface of said semiconductor body using a diluted HF chemistry.

2. The method of claim 1, further comprising the step of etching said slag with diluted nitric acid prior to said passivating step.

3. The method of claim 1, further comprising the step of etching said slag with diluted nitric acid and $H_2O_2$ solution prior to said passivating step.

4. The method of claim 1, wherein said base solution comprises KOH.

5. The method of claim 1, wherein said base solution comprises TMAH.

6. The method of claim 1, wherein said base solution comprises $NH_4OH$.

7. The method of claim 1, wherein said elevated temperature is in the range of 50–70° C.

8. The method of claim 1, wherein said triazole compound comprises benzatriazole.

9. The method of claim 1, further comprising the step of subjecting said semiconductor body to a diluted organic acid etch to clean a surface of said second subset of copper fuses.

10. The method of claim 1, further comprising the step of performing a dry $H_2$ passivation step after said cleaning step to remove any oxides from said copper portion of said surface of said semiconductor body.

* * * * *